(12) United States Patent
Wang et al.

(10) Patent No.: US 9,130,165 B2
(45) Date of Patent: *Sep. 8, 2015

(54) ATOMIC LAYER DEPOSITION OF METAL OXIDE MATERIALS FOR MEMORY APPLICATIONS

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Tony P. Chiang, Campbell, CA (US); Vidyut Gopal, Sunnyvale, CA (US); Imran Hashim, Saratoga, CA (US); Dipankar Pramanik, Saratoga, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/506,298

(22) Filed: Oct. 3, 2014

(65) Prior Publication Data

US 2015/0056749 A1    Feb. 26, 2015

Related U.S. Application Data

(63) Continuation of application No. 13/897,050, filed on May 17, 2013, now Pat. No. 8,883,655, which is a continuation of application No. 13/612,000, filed on Sep. 12, 2012, now Pat. No. 8,466,446, which is a continuation of application No. 13/224,021, filed on Sep. 1, 2011, now Pat. No. 8,288,297.

(51) Int. Cl.
*H01L 47/00*    (2006.01)
*H01L 45/00*    (2006.01)
(Continued)

(52) U.S. Cl.
CPC ............. *H01L 45/145* (2013.01); *C23C 16/40* (2013.01); *C23C 16/45525* (2013.01); *H01L 21/022* (2013.01); *H01L 21/0228* (2013.01); *H01L 21/02175* (2013.01); *H01L 21/02178* (2013.01); *H01L 21/02181* (2013.01); *H01L 21/02186* (2013.01); *H01L 21/02189* (2013.01);
(Continued)

(58) Field of Classification Search
USPC ............................................................ 257/4
See application file for complete search history.

(56) References Cited

U.S. PATENT DOCUMENTS

8,288,297 B1 * 10/2012 Wang et al. .................... 438/785
8,466,446 B2 * 6/2013 Wang et al. ........................ 257/4
8,883,655 B2 * 11/2014 Wang et al. .................... 438/785

*Primary Examiner* — Asok K Sarkar (57) ABSTRACT

Embodiments of the invention generally relate to nonvolatile memory devices, such as a ReRAM cells, and methods for manufacturing such memory devices, which includes optimized, atomic layer deposition (ALD) processes for forming metal oxide film stacks. The metal oxide film stacks contain a metal oxide coupling layer disposed on a metal oxide host layer, each layer having different grain structures/sizes. The interface disposed between the metal oxide layers facilitates oxygen vacancy movement. In many examples, the interface is a misaligned grain interface containing numerous grain boundaries extending parallel to the electrode interfaces, in contrast to the grains in the bulk film extending perpendicular to the electrode interfaces. As a result, oxygen vacancies are trapped and released during switching without significant loss of vacancies. Therefore, the metal oxide film stacks have improved switching performance and reliability during memory cell applications compared to traditional hafnium oxide based stacks of previous memory cells.

20 Claims, 3 Drawing Sheets

(51) Int. Cl.
C23C 16/40 (2006.01)
C23C 16/455 (2006.01)
H01L 21/02 (2006.01)
H01L 27/24 (2006.01)

(52) U.S. Cl.
CPC .... *H01L21/02192* (2013.01); *H01L 21/02194* (2013.01); *H01L 45/08* (2013.01); *H01L 45/1266* (2013.01); *H01L 45/146* (2013.01); *H01L 45/1608* (2013.01); *H01L 45/1616* (2013.01); *H01L 27/2463* (2013.01)

ATOMIC LAYER DEPOSITION OF METAL OXIDE MATERIALS FOR MEMORY APPLICATIONS

CROSS-REFERENCE TO RELATED APPLICATIONS

This application is a continuation of U.S. Ser. No. 13/897,050, filed on May 17, 2013, which is a continuation of U.S. Ser. No. 13/612,000, filed on Sep. 12, 2012, which is a continuation of U.S. Ser. No. 13/224,021, filed on Sep. 1, 2011, each of which are incorporated herein by reference in their entirety for all purposes.

BACKGROUND OF THE INVENTION

1. Field of the Invention

Embodiments of the invention generally relate to memory devices and methods for manufacturing such memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Similar issues can arise from integration of the resistive switching memory element with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (e.g., logic states of the device). However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., about 2-5 volts).

As nonvolatile memory device sizes shrink, it is important to reduce the required currents and voltages that are necessary to reliably set, reset and/or determine the desired "on" and "off" states of the device to minimize resistive heating of the device and cross-talk between adjacent devices. Moreover, in cases where multiple formed memory devices are interconnected to each other and to other circuit elements it is desirable to minimize the device performance variation between one device to the next to assure that the performance of the formed circuit performs in a desirable manner.

The transition metal oxide materials used within the resistive switching elements have been doped with highly reactive dopant metals which cause problems to the bulk switching layer. Highly reactive dopant metals may extract oxygen from the bulk switching layer and cause excessive leakage in the resistive switching element. Also, it is usually difficult to control the removal of appreciable amount of oxygen from the metal oxide films. If the metal oxide film contains hafnium oxide, the loss of too much oxygen provides an excess hafnium metal which in turn may cause device failure. The excess hafnium metal may chemical reduces silicon oxide material generally disposed between the bottom electrode and the metal oxide film and turn forms hafnium silicide—which has undesirable properties at this interface.

Therefore, there is a need for an efficient and controllable process to form a metal oxide film stack for a nonvolatile memory device.

SUMMARY OF THE INVENTION

Embodiments of the invention generally relate to nonvolatile memory devices and methods for manufacturing such memory devices. Embodiments described herein provide methods for forming improved memory devices, such as a ReRAM cells, and also provide optimized, atomic layer deposition (ALD) processes for forming metal oxide film stacks. The metal oxide film stacks described herein contain at least two metal oxide layers, such as a metal oxide coupling layer disposed on a metal oxide host layer. In some examples, the metal oxide film stacks may contain an amorphous metal oxide coupling layer disposed on a crystalline metal oxide host layer—therefore—the crystalline metal oxide layer has a grain boundary which adjoins the amorphous metal oxide layer at the interface therebetween. In other examples, each of the metal oxide layers contained within the metal oxide film stacks is crystalline and has a different grain structure and/or size from the other—therefore—these crystalline metal oxide layers have different grain boundaries adjoining at a misaligned grain interface therebetween.

The misaligned grain interface disposed between the two metal oxide layers facilitates oxygen vacancy movement or filamentary formation. The misaligned grain interface contains numerous grain boundaries that extend parallel to the electrode interfaces, in contrast to the grains in the bulk film that extend perpendicular to the electrode interfaces. As a result, oxygen vacancies are trapped and released during switching without any overall loss or without significant loss of vacancies. Therefore, the metal oxide film stacks have improved switching performance and reliability during memory cell applications—compared to previous memory cells which generally contain traditional hafnium oxide based stacks.

The described ALD processes are techniques for depositing ultra-thin metal oxide films due to practical advantages which includes simple and accurate thickness control, precise control of dopant/element concentrations and distributions, excellent reproducibility and uniformity, and capability to produce conformal films at sharp interfaces and trenches with high aspect ratio.

In one embodiment, a metal oxide film stack, disposed between upper and lower electrodes, contains a metal oxide coupling layer disposed on a metal oxide host layer and a grain boundary formed at the interface of the metal oxide host layer and the metal oxide coupling layer. In one example, a crystalline hafnium oxide layer may be formed by a first ALD process and an amorphous hafnium aluminate layer may be formed by a second ALD process.

In another embodiment, the metal oxide film stack contains a crystalline metal oxide coupling layer disposed on a crystalline metal oxide host layer such that the metal oxide layers have a misaligned grain interface formed therebetween. The crystalline metal oxide material of the host layer has an average grain size greater than the crystalline metal oxide material of the coupling layer.

In one embodiment described herein, a method for fabricating a resistive switching memory element, such as a memory device, is provided and includes forming a metal oxide film stack over a lower electrode disposed on a substrate, wherein the metal oxide film stack contains a metal oxide coupling layer disposed on a metal oxide host layer, and an interface is formed between the metal oxide host layer and the metal oxide coupling layer. The interface facilitates oxygen vacancy between the crystalline metal-rich oxide host material of the metal oxide host layer and the amorphous metal-rich oxide coupling material of the metal oxide coupling layer.

The method further provides forming the metal oxide film stack which includes depositing the metal oxide host layer over the lower electrode during a first ALD process, wherein the metal oxide host layer substantially contains a crystalline metal-rich oxide host material. The crystalline metal-rich oxide host material may be represented by the generic chemical formula of $MO_x$, where M is a metal selected from hafnium, zirconium, or titanium and x may be within a range from about 1.65 to about 1.95. The method also includes depositing the metal oxide coupling layer over the metal oxide host layer during a second ALD process, wherein the metal oxide coupling layer may be a metal oxide laminate and may substantially contain an amorphous metal-rich oxide coupling material. The amorphous metal-rich oxide coupling material may be represented by the generic chemical formula of $MM'_yO_z$, where M may be the same type of metal selected for the crystalline metal-rich oxide host material contained within the metal oxide host layer, M' may be a dopant metal selected from aluminum, yttrium, or lanthanum, y may be within a range from about 0.05 to about 0.50, and z may be within a range from about 1.50 to about 2.50.

In some of the described examples, an amorphous hafnium aluminate layer may be deposited, formed, or otherwise disposed on or over a crystalline hafnium oxide layer. In one example, the crystalline metal-rich oxide host material has the generic chemical formula of $HfO_x$, where x may be within a range from about 1.70 to about 1.90, and the amorphous metal-rich oxide coupling material has the generic chemical formula of $HfAl_yO_z$, where y may be within a range from about 0.05 to about 0.50, and z may be within a range from about 1.50 to about 2.50. In some examples, the aluminum dopant is light or has a low concentration such that y may be within a range from about 0.05 to about 0.15 and z may be within a range from about 1.50 to about 2.10. In other examples, the aluminum dopant is heavy or has a high concentration such that y may be within a range from about 0.40 to about 0.50 and z may be within a range from about 2.10 to about 2.50. In many examples, x may be within a range from about 1.75 to about 1.85, for example, about 1.80.

The metal oxide host layer may have a thickness within a range from about 5 Å to about 100 Å, such as from about 10 Å to about 80 Å, such as from about 15 Å to about 50 Å, for example, about 30 Å. The metal oxide coupling layer may have a thickness within a range from about 3 Å to about 80 Å, such as from about 5 Å to about 50 Å, such as from about 5 Å to about 30 Å, for example, about 20 Å.

In one embodiment, the first ALD process includes sequentially providing a metal source gas and an oxidizing agent into a deposition chamber during a metal-rich oxidizing ALD process. The metal source gas may contain a tetrakis(dialkylamido) hafnium compound and the oxidizing agent may contain water during the metal-rich oxidizing ALD process. In some examples, the tetrakis(dialkylamido) hafnium compound is tetrakis(dimethylamido) hafnium. The second ALD process includes sequentially providing a first metal source gas, a second metal source gas, and an oxidizing agent into the deposition chamber during a metal-rich oxidizing ALD process. The first metal source gas may contain a tetrakis(dialkylamido) hafnium compound, the second metal source gas may contain an alkyl aluminum compound, and the oxidizing agent may contain water. In some examples, the tetrakis(dialkylamido) hafnium compound is tetrakis(dimethylamido) hafnium and the alkyl aluminum compound is trimethylaluminum.

In another embodiment, the first ALD process further includes sequentially providing a first metal source gas, a purge gas, an oxidizing agent, and the purge gas into a deposition chamber while forming the crystalline metal-rich oxide host material during a first ALD cycle during the first ALD process, and repeating the first ALD cycle while increasing the thickness of the metal oxide host layer until the thickness is within a range from about 5 Å to about 100 Å. Additionally, the second ALD process further includes sequentially providing a second metal source gas, the purge gas, the first metal source gas, the purge gas, the oxidizing agent, and the purge gas into the deposition chamber while forming the amorphous metal-rich oxide coupling material during a second ALD cycle during the second ALD process. Thereafter, the method includes repeating the second ALD cycle while increasing the thickness of the metal oxide coupling layer until the thickness is within a range from about 3 Å to about 80 Å. In some examples the first metal source gas may contain a tetrakis(dialkylamido) hafnium compound, the second metal source gas may contain an alkyl aluminum compound, the oxidizing agent may contain water, and the purge gas may contain argon, nitrogen, hydrogen, mixtures thereof, or combinations thereof.

In another embodiment, the method further provides forming a silicon oxide layer over the lower electrode, and subsequently, forming the metal oxide host layer over the silicon oxide layer. The silicon oxide layer may contain native silicon oxides or silicon dioxide. Generally, the silicon oxide layer has a thickness within a range from about 2 Å to about 20 Å. a thickness within a range from about 2 Å to about 40 Å, such as from about 2 Å to about 20 Å, such as from about 5 Å to about 10 Å.

In various other examples, the metal source gas may contain a tetrakis(dialkylamido) zirconium compound, such as tetrakis(dimethylamido) zirconium, or a tetrakis(dialkylamido) titanium compound, such as tetrakis(dimethylamido) titanium, and the oxidizing agent may contain water during the metal-rich oxidizing ALD process.

In another embodiment described herein, a method for fabricating a resistive switching memory element, such as a memory device, is provided and includes forming a metal oxide film stack over a lower electrode disposed on a substrate, wherein the metal oxide film stack contains a metal oxide coupling layer disposed on a metal oxide host layer. A misaligned grain interface is formed between the grain boundary of the metal oxide host layer and the grain boundary of the metal oxide coupling layer. The misaligned grain interface facilitates oxygen vacancy between the metal-rich oxide host material and the metal-rich oxide coupling material. The method further provides forming the metal oxide film stack which includes forming the metal oxide host layer over the lower electrode during a first ALD process, wherein the metal oxide host layer substantially contains a crystalline metal-rich oxide host material having the generic chemical formula of $MO_x$, where M is a metal selected from hafnium, zirconium, or titanium and x may be within a range from about 1.65 to about 1.95.

The method further includes forming the metal oxide coupling layer over the metal oxide host layer during a second ALD process, wherein the metal oxide coupling layer substantially contains a crystalline metal-rich oxide coupling material having the generic chemical formula of $M'O_y$, where M' is a metal selected from hafnium, zirconium, or titanium, y may be within a range from about 1.65 to about 1.95, and an average grain size of the crystalline $MO_x$ host material is greater than an average grain size of the crystalline $M'O_y$ coupling material.

In many embodiments, a grain size ratio of the average grain size of the crystalline $MO_x$ host material to the average grain size of the crystalline $M'O_y$ coupling material is within a range from about 1.05 to about 2.0. In some examples, the grain size ratio may be within a range from about 1.10 to about 1.50, for example, about 1.25. The average grain size of the crystalline $MO_x$ host material may be within a range from about 30 nm to about 40 nm, and the average grain size of the crystalline $MO_x$ coupling material may be within a range from about 25 nm to about 35 nm.

In some examples, the crystalline metal-rich oxide host material has the generic chemical formula of $HfO_x$, where x may be within a range from about 1.70 to about 1.90, and the crystalline metal-rich oxide coupling material has the generic chemical formula of $ZrO_y$, where y may be within a range from about 1.70 to about 1.90. In other examples, x may be within a range from about 1.75 to about 1.85 and y may be within a range from about 1.75 to about 1.85, for example, about 1.80. The metal oxide host layer may have a thickness within a range from about 5 Å to about 100 Å, such as from about 10 Å to about 80 Å, such as from about 15 Å to about 50 Å, for example, about 30 Å. The metal oxide coupling layer may have a thickness within a range from about 3 Å to about 80 Å, such as from about 5 Å to about 20 Å, such as from about 5 Å to about 10 Å, for example, about 8 Å.

In other examples, the crystalline metal-rich oxide host material has the generic chemical formula of $HfO_x$, where x may be within a range from about 1.70 to about 1.90, and the crystalline metal-rich oxide coupling material has the generic chemical formula of $HfO_y$ or $TiO_y$, where y may be within a range from about 1.70 to about 1.90.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to nonvolatile memory devices and methods for manufacturing such memory devices. Embodiments of the invention generally relate to nonvolatile memory devices and methods for manufacturing such memory devices. Embodiments described herein provide methods for forming improved memory devices, such as a ReRAM cells, and also provide optimized, atomic layer deposition (ALD) processes for forming metal oxide film stacks. The metal oxide film stacks described herein contain at least two metal oxide layers adjacent to or in contact with each other, such as a metal oxide coupling layer disposed on a metal oxide host layer. The metal oxide layers contain different metal oxide materials and each metal oxide material has a different grain structure and/or size from the other—therefore the metal oxide layers have a grain boundary disposed at the interface therebetween.

The interface disposed between the two metal oxide layers facilitates oxygen vacancy movement or filamentary formation. The interface contains numerous grain boundaries that extend parallel to the electrode interfaces, in contrast to the grains in the bulk film that extend perpendicular to the electrode interfaces. As a result, oxygen vacancies are trapped and released during switching without any overall loss or without significant loss of vacancies. Therefore, the metal oxide film stacks have improved switching performance and reliability during memory cell applications—compared to previous memory cells which generally contain traditional hafnium oxide based stacks.

Figure 1:
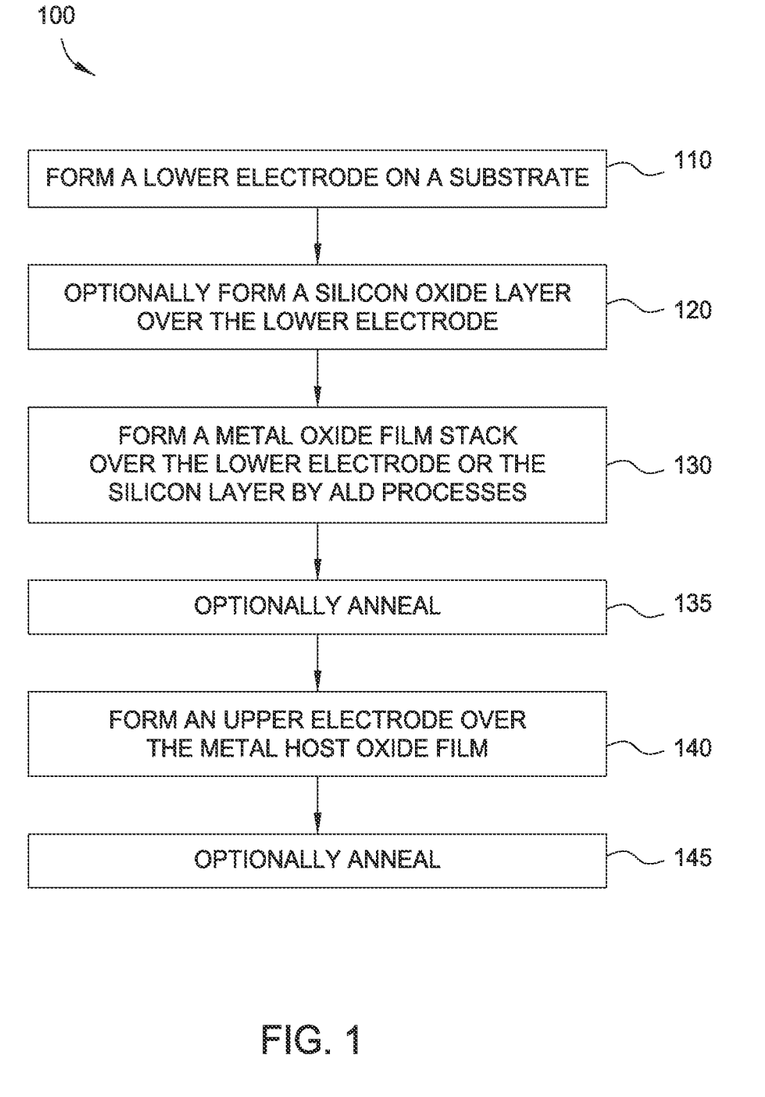
FIG. 1 is a flowchart illustrating a method to form a memory device, as described by embodiments herein.
Figure 2A:
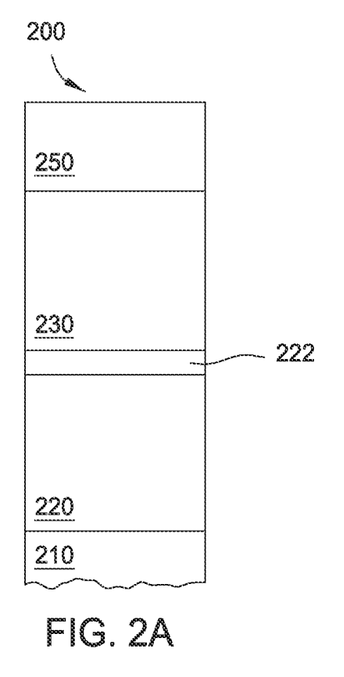
FIG. 2A depicts a memory device which may be formed by a method illustrated in FIG. 1, as described by embodiments herein.
Figure 2B:
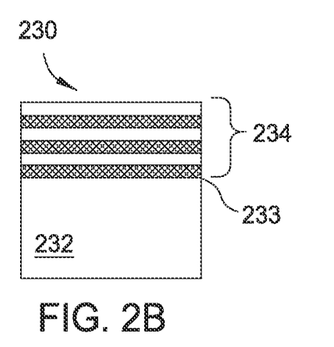
FIGS. 2B-2C depict various metal oxide film stacks which may be formed within the memory device illustrated in FIG. 2A, as described by other embodiments herein.
Figure 2C:
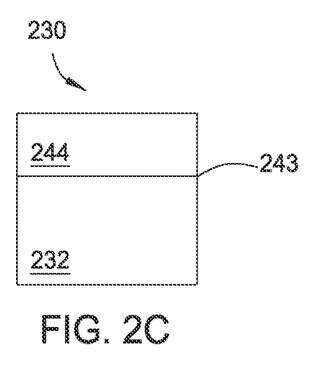

FIG. 1 is a flowchart illustrating a method for manufacturing or otherwise forming various memory devices, as described by embodiments herein, such as process 100 which may be utilized to form resistive switching memory elements/devices, such as memory device 200, as depicted in FIG. 2A. In one embodiment, process 100 may be used to form memory device 200 and includes forming lower electrode 220 on or over substrate 210 during step 110, optionally forming silicon oxide layer 222 on or over lower electrode 220 during step 120, forming metal oxide film stack 230 on or over silicon oxide layer 222 or lower electrode 220 by ALD processes during step 130, optionally annealing memory device 200 during step 135, depositing upper electrode 250 on or over metal oxide film stack 230 during step 140, and optionally annealing memory device 200 during step 145. FIGS. 2B-2C depict a variety of metal oxide film stacks 230 formed by different ALD techniques during step 130, as described by embodiments herein.

In many embodiments, several different metal oxide film stacks 230, as depicted in FIGS. 2B-2C, may be formed by different ALD techniques during step 130 of process 100, and contained within memory device 200 depicted in FIG. 2A. Each of the metal oxide film stacks 230 depicted in FIGS. 2B-2C may be disposed between lower electrode 220 and upper electrode 250 of memory device 200. Therefore, any of the particular lower layers depicted in each of the metal oxide film stacks 230 may be on or over lower electrode 220. Similarly, upper electrode 250 may be on or over any of the particular upper layers depicted in each of the metal oxide film stacks 230. Silicon oxide layer 222 may be deposited, formed, or otherwise disposed on or over lower electrode 220.

In one embodiment, a method for fabricating a resistive switching memory element, such as memory device 200, is provided and includes forming metal oxide film stack 230 during step 130 of process 100. Metal oxide film stack 230 contains metal oxide coupling layer 234 disposed on metal oxide host layer 232, as depicted in FIG. 2B. Metal oxide host layer 232 contains a crystalline metal-rich oxide host material and metal oxide coupling layer 234 contains an amorphous metal-rich oxide coupling material. Therefore, the crystalline structure of metal oxide host layer 232 has a grain boundary at interface 233 which is adjacent to or otherwise in contact with the amorphous structure of metal oxide coupling layer 234. Interface 233 facilitates oxygen vacancy between the crystalline metal-rich oxide host material of metal oxide host layer 232 and the amorphous metal-rich oxide coupling material of metal oxide coupling layer 234. The crystalline metal-rich oxide host material contained within metal oxide host layer 232 may be represented by the generic chemical formula of $MO_x$, where M is a metal selected from hafnium, zirconium, or titanium and x may be within a range from about 1.65 to about 1.95. The amorphous metal-rich oxide coupling material contained within metal oxide coupling layer 234 may be represented by the generic chemical formula of $MM'_yO_z$, where M is the same type of metal selected for the crystalline metal-rich oxide host material contained within metal oxide host layer 232, M' is a dopant metal selected from aluminum, yttrium, or lanthanum, y may be within a range from about 0.05 to about 0.50, and z may be within a range from about 1.50 to about 2.50.

In another embodiment, metal oxide film stack 230, formed during step 130 of process 100, contains crystalline metal oxide coupling layer 244 disposed on metal oxide host layer 232, as depicted in FIG. 2C. Metal oxide host layer 232 contains a crystalline metal-rich oxide host material and crystalline metal oxide coupling layer 244 contains a crystalline metal-rich oxide coupling material. The crystalline structure of metal oxide host layer 232—having one grain boundary—is adjacent to or otherwise in contact with the crystalline structure of crystalline metal oxide coupling layer 244—having another grain boundary. The crystalline metal-rich oxide host material and the crystalline metal-rich oxide coupling material have different average grain sizes relative to each other—therefore—have different grain boundaries at interface 243—which form a misaligned grain interface. In many examples, the average grain size of the crystalline metal-rich oxide host material is greater than the average grain size of the crystalline metal-rich oxide coupling material.

The misaligned grain interface facilitates oxygen vacancy between the metal-rich oxide host material contained within metal oxide host layer 232 and the metal-rich oxide coupling material contained within crystalline metal oxide coupling layer 244. The crystalline metal-rich oxide host material of metal oxide host layer 232 may have the generic chemical formula of $MO_x$, where M is a metal selected from hafnium, zirconium, or titanium and x may be within a range from about 1.65 to about 1.95. The crystalline metal-rich oxide coupling material of crystalline metal oxide coupling layer 244 may have the generic chemical formula of $M'O_y$, where M' is a metal selected from hafnium, zirconium, or titanium, y may be within a range from about 1.65 to about 1.95.

In various embodiments, process 100 further provides step 120 which includes optionally forming silicon oxide layer 222 on or over lower electrode 220, and subsequently, forming metal oxide bulk layer 232 on or over silicon oxide layer 222, as depicted in FIGS. 2B-2C. Silicon oxide layer 222 contains a silicon oxide material, such as native silicon oxides, silicon dioxide, dopant variants thereof, or combinations thereof. Silicon oxide layer 222 may contain a single layer or multiple layers of the same or different silicon oxide materials. Usually, silicon oxide layer 222 may be continuously formed, deposited, or otherwise disposed on or over lower electrode 220 or other underlying surfaces. Alternatively, silicon oxide layer 222 may also be discontinuously formed, deposited, or otherwise disposed on or over lower electrode 220 or other underlying surfaces. Silicon oxide layer 222 may have a thickness within a range from about 2 Å to about 40 Å, such as from about 2 Å to about 20 Å, such as from about 5 Å to about 10 Å.

The method further provides forming metal oxide film stack 230 which includes depositing metal oxide host layer 232 over lower electrode 220 during a first ALD process, wherein metal oxide host layer 232 substantially contains a crystalline metal-rich oxide host material. The crystalline metal-rich oxide host material of metal oxide host layer 232 may be represented by the generic chemical formula of $MO_x$, where M is a metal selected from hafnium, zirconium, or titanium and x may be within a range from about 1.65 to about 1.95, such as from about 1.70 to about 1.90, such as from about 1.75 to about 1.85, for example, about 1.80. The method also includes depositing metal oxide coupling layer 234 over metal oxide host layer 232 during a second ALD process, wherein metal oxide coupling layer 234 is a metal oxide laminate and substantially contains an amorphous metal-rich oxide coupling material.

The amorphous metal-rich oxide coupling material of metal oxide coupling layer 234 may be represented by the generic chemical formula of MM'$_y$O$_z$, where M is hafnium, zirconium, or titanium, M' is a dopant metal selected from aluminum, yttrium, or lanthanum, y may be within a range from about 0.05 to about 0.50, and z may be within a range from about 1.50 to about 2.50. In many embodiments, the amorphous metal-rich oxide coupling material of metal oxide coupling layer 234 may be represented by the generic chemical formula of MM'$_y$O$_z$, where M is the same type of metal as the metal selected for MO$_x$, the crystalline metal-rich oxide host material of metal oxide host layer 232. In an alternative embodiment, the amorphous metal-rich oxide coupling material (MM'$_y$O$_z$) of metal oxide coupling layer 234 may contain a different metal M than the metal M selected for the crystalline metal-rich oxide host material (MO$_x$) of metal oxide host layer 232.

The amorphous metal-rich oxide coupling material of metal oxide coupling layer 234 may be lightly or heavily doped with aluminum, yttrium, or lanthanum, such as to have a dopant concentration may be provided by y and z values for MM'$_y$O$_z$. In some of the light doping or low concentration examples, y may be within a range from about 0.05 to about 0.15 and z may be within a range from about 1.50 to about 2.10. In some of the heavy doping or high concentration examples, y may be within a range from about 0.40 to about 0.50 and z may be within a range from about 2.10 to about 2.50.

In several examples described herein, metal oxide coupling layer 234 contains an amorphous hafnium aluminate layer which may be deposited, formed, or otherwise disposed on or over metal oxide host layer 232 containing a crystalline hafnium oxide layer. In one example, the crystalline metal-rich oxide host material of metal oxide host layer 232 may have the generic chemical formula of HfO$_x$, where x may be within a range from about 1.65 to about 1.95, such as from about 1.70 to about 1.90, such as from about 1.75 to about 1.85, for example, about 1.80. The amorphous hafnium aluminate of metal oxide coupling layer 234 may have the generic chemical formula of HfAl$_y$O$_z$, where y may be within a range from about 0.05 to about 0.50, and z may be within a range from about 1.50 to about 2.50. Therefore, a light doping of aluminum provides that y may be within a range from about 0.05 to about 0.15 and z may be within a range from about 1.50 to about 2.10. A heavy doping of aluminum provides that y may be within a range from about 0.40 to about 0.50 and z may be within a range from about 2.10 to about 2.50.

In one example, the amorphous metal-rich oxide coupling material of metal oxide coupling layer 234 contains hafnium aluminum oxide with a high aluminum doping concentration within a range from about 20 at % (atomic percent) to about 60 at %, such as from about 30 at % to about 55 at %, such as from about 40 at % to about 50 at %, for example, about 45 at % relative to the hafnium atomic concentration. In another example, the amorphous metal-rich oxide coupling material of metal oxide coupling layer 234 contains hafnium aluminum oxide with a low aluminum doping concentration within a range from about 2 at % to about 20 at %, such as from about 4 at % to about 15 at %, such as from about 5 at % to about 10 at %, for example, about 7 at % or about 8 at % relative to the hafnium atomic concentration.

Metal oxide host layer 232 may have a thickness within a range from about 5 Å to about 100 Å, such as from about 10 Å to about 80 Å, such as from about 15 Å to about 50 Å, for example, about 30 Å. Metal oxide coupling layer 234 may have a thickness within a range from about 3 Å to about 80 Å, such as from about 5 Å to about 50 Å, such as from about 5 Å to about 30 Å, for example, about 20 Å.

In one embodiment, the crystalline metal-rich oxide host material of metal oxide host layer 232 may be formed by a first ALD process which includes sequentially flowing, pulsing, or otherwise providing a metal source gas and an oxidizing agent into a deposition chamber during a metal-rich oxidizing ALD process. The metal source gas may contain a hafnium precursor, a zirconium precursor, or a titanium precursor and the oxidizing agent may contain water, ozone, oxygen plasma, or other oxygen sources described herein. In some examples, the source gas may contain a tetrakis(dialkylamido) hafnium compound, such as tetrakis(dimethylamido) hafnium or a hafnium halide compound, such as hafnium tetrachloride, as the hafnium precursor and the oxidizing agent may contain water during the metal-rich oxidizing ALD process.

Thereafter, the amorphous metal-rich oxide coupling material of metal oxide coupling layer 234 may be formed by a second ALD process which includes sequentially flowing, pulsing, or otherwise providing a first metal source gas, a second metal source gas, and an oxidizing agent into the deposition chamber during a metal-rich oxidizing ALD process. The first metal source gas may contain a hafnium precursor, a zirconium precursor, or a titanium precursor. In one embodiment, the first source gas is the same for both the first and second ALD processes. The second metal source may contain an aluminum precursor, an yttrium precursor, or a lanthanum precursor. The oxidizing agent may contain water, ozone, oxygen plasma, or other oxygen sources described herein. In some examples, the first source gas may contain a tetrakis(dialkylamido) hafnium compound, such as tetrakis(dimethylamido) hafnium, the second metal source gas may contain an alkyl aluminum compound, such as trimethylaluminum, and the oxidizing agent may contain water.

In another embodiment for forming metal oxide host layer 232, the first ALD process further includes sequentially flowing, pulsing, or otherwise providing a first metal source gas, a purge gas, an oxidizing agent, and the purge gas into a deposition chamber while forming the crystalline metal-rich oxide host material of during an ALD cycle of the first ALD process, and repeating the ALD cycle of the first ALD process while increasing the thickness of metal oxide host layer 232 until the thickness is within a range from about 5 Å to about 100 Å. Also, the second ALD process further includes sequentially flowing, pulsing, or otherwise providing a second metal source gas, the purge gas, the first metal source gas, the purge gas, the oxidizing agent, and the purge gas into the deposition chamber while forming the amorphous metal-rich oxide coupling material during an ALD cycle of the second ALD process. Thereafter, the method includes repeating the ALD cycle of the second ALD process while increasing the thickness of metal oxide coupling layer 234 until the thickness is within a range from about 3 Å to about 80 Å.

In many of these examples, the first metal source gas may contain a hafnium precursor, such as tetrakis(dimethylamido) hafnium, the second metal source gas may contain an aluminum precursor, such as trimethylaluminum, the oxidizing agent may contain water, ozone, or oxygen plasma, and the purge gas may contain argon, nitrogen, hydrogen, mixtures thereof, or combinations thereof. In other examples, the first metal source gas may contain a zirconium precursor, such as a tetrakis(dialkylamido) zirconium compound, for example, tetrakis(dimethylamido) zirconium, or a zirconium halide, such as zirconium tetrachloride. Also, the first metal source gas may contain a titanium precursor, such as a tetrakis(dialkylamido) titanium compound, for example, tetrakis(dimethylamido) titanium, or a titanium halide, such as titanium tetrachloride.

In many embodiments, a grain size ratio of the average grain size of the crystalline $MO_x$ host material to the average grain size of the crystalline $M'O_y$ coupling material is greater than 1, such as within a range from about 1.05 to about 2.0 or greater. In some examples, the grain size ratio may be within a range from about 1.10 to about 1.50, for example, about 1.25. The average grain size of the crystalline $MO_x$ host material may be within a range from about 30 nm to about 40 nm, and the average grain size of the crystalline $MO_x$ coupling material may be within a range from about 25 nm to about 35 nm.

The crystalline metal-rich oxide host material of metal oxide host layer 232 may have the generic chemical formula of $HfO_x$, where x may be within a range from about 1.70 to about 1.90, and the crystalline metal-rich oxide coupling material of crystalline metal oxide coupling layer 244 may have the generic chemical formula of $ZrO_y$, where y may be within a range from about 1.70 to about 1.90. In some examples, x may be within a range from about 1.75 to about 1.85 and y may be within a range from about 1.75 to about 1.85, for example, about 1.80. In additional examples of the hafnium-rich oxide host material contained within metal oxide host layer 232, the crystalline metal-rich oxide coupling material of crystalline metal oxide coupling layer 244 may have the generic chemical formula of $HfO_y$ or $TiO_y$, where y may be within a range from about 1.70 to about 1.90.

Metal oxide host layer 232 may have a thickness within a range from about 5 Å to about 100 Å, such as from about 10 Å to about 80 Å, such as from about 15 Å to about 50 Å, for example, about 30 Å. Crystalline metal oxide coupling layer 244 may have a thickness within a range from about 3 Å to about 80 Å, such as from about 5 Å to about 20 Å, such as from about 5 Å to about 10 Å, for example, about 8 Å.

In one embodiment, the first ALD process includes sequentially flowing, pulsing, or otherwise providing a metal source gas and an oxidizing agent into a deposition chamber during a metal-rich oxidizing ALD process while forming the crystalline metal-rich oxide host material of metal oxide host layer 232. The metal source gas may contain a hafnium precursor, a zirconium precursor, or a titanium precursor and the oxidizing agent may contain water, ozone, oxygen plasma, or other oxygen sources described herein. In some examples, a tetrakis(dialkylamido) hafnium compound, such as tetrakis (dimethylamido) hafnium, may be the hafnium precursor and the oxidizing agent may contain water during the metal-rich oxidizing ALD process.

The second ALD process includes sequentially flowing, pulsing, or otherwise providing a second metal source gas (e.g., zirconium precursor), and an oxidizing agent into the deposition chamber during a metal-rich oxidizing ALD process while forming the crystalline metal-rich oxide coupling material of crystalline metal oxide coupling layer 244. The oxidizing agent may be the same in the first and second ALD processes or a different oxidizing agent may be used in the second ALD process as used in the first ALD process.

The first metal source gas and the second metal source gas may each independently contain a hafnium precursor, a zirconium precursor, or a titanium precursor. Generally, the first metal source gas and the second metal source gas contain different metal precursors. In one example, the first metal source gas may contain a hafnium precursor and the second metal source gas may contain a zirconium precursor. The oxidizing agent may contain water, ozone, oxygen plasma, or other oxygen sources described herein. In some examples, the first source gas may contain a tetrakis(dialkylamido) hafnium compound, such as tetrakis(dimethylamido) hafnium or a hafnium halide compound, such as hafnium tetrachloride, the second metal source gas may contain a tetrakis(dialkylamido) zirconium compound, such as tetrakis(dimethylamido) zirconium or a zirconium halide compound, such as zirconium tetrachloride, and the oxidizing agent may contain water.

In another embodiment, the first ALD process further includes sequentially flowing, pulsing, or otherwise providing a first metal source gas, a purge gas, an oxidizing agent, and the purge gas into the deposition chamber while forming the crystalline metal-rich oxide host material of metal oxide host layer 232 during an ALD cycle of the first ALD process, and repeating the ALD cycle of the first ALD process while increasing the thickness of metal oxide host layer 232 until the thickness is within a range from about 5 Å to about 100 Å.

Additionally, the second ALD process further includes sequentially flowing, pulsing, or otherwise providing a second metal source gas, the purge gas, the oxidizing agent, and the purge gas into the deposition chamber while forming the crystalline metal-rich oxide coupling material of crystalline metal oxide coupling layer 244 during an ALD cycle of the second ALD process. Thereafter, the method includes repeating the ALD cycle of the second ALD process while increasing the thickness of crystalline metal oxide coupling layer 244 until the thickness is within a range from about 3 Å to about 80 Å. The purge gas may contain argon, nitrogen, hydrogen, mixtures thereof, or combinations thereof.

In one embodiment described herein, substrate 210 and/or memory device 200 may be maintained at a deposition temperature or a substrate temperature within a range from greater than 0° C. to about 20° C., such as from greater than 0° C. to about 10° C., such as from greater than 0° C. to about 5° C., for example about 1° C. during the metal-rich oxidizing ALD process.

Some of the materials and/or layers of metal oxide film stack 230 may be deposited or otherwise formed using a variety of deposition techniques, but in many embodiments described herein, all of the materials and/or layers of metal oxide film stack 230 may be deposited using thermal ALD processes and/or plasma-enhanced ALD (PE-ALD). In one embodiment, a metal-rich oxide material may be formed by a metal-rich oxidizing ALD process utilizing water and a metal-poor oxide material may be formed by a metal-poor oxidizing ALD process utilizing an activated oxygen agent, such as ozone, atomic oxygen, oxygen plasma, derivatives thereof, or combinations thereof.

The ALD processes described herein may include heating the memory device, the substrate, or the substrate carrier/pedestal to a deposition temperature within a range from about 50° C. to about 500° C., such as from about 200° C. to about 350° C., such as from about 250° C. to about 300° C. In one example, the deposition temperature during a metal-poor oxidizing ALD process may be about 275° C. In another example, the deposition temperature during a metal-rich oxidizing ALD process may be about 250° C.

In one example, a method of process 100 for forming memory device 200 on the surface of substrate 210 includes forming lower electrode 220 containing polysilicon disposed on or over substrate 210 (step 110), optionally forming silicon oxide layer 222 on or over lower electrode 220 (step 120), forming metal oxide film stack 230 on or over silicon oxide layer 222 and/or lower electrode 220 (step 130), optionally annealing memory device 200 (step 135), depositing upper electrode 250 on or over metal oxide film stack 230 (step 140), and optionally annealing memory device 200 (step 145), such as a post electrode anneal. In many examples, lower electrode 220 contains an n-type polysilicon material and upper electrode 250 contains titanium nitride or derivative thereof.

In another embodiment described herein, a method includes forming metal oxide film stack 230 during step 130 of process 100, wherein metal oxide host layer 232 is treated to a first post metal oxide anneal and/or a plasma anneal prior to forming crystalline metal oxide coupling layer 244. Subsequent the first post metal oxide anneal and/or a plasma anneal, crystalline metal oxide coupling layer 244 may be formed on the treated metal oxide host layer 232 while forming metal oxide film stack 230, as depicted in FIG. 2C. Thereafter, metal oxide film stack 230 containing crystalline metal oxide coupling layer 244 disposed on the treated metal oxide host layer 232 may be exposed to a second post metal oxide anneal.

Step 130 includes the first post metal oxide anneal, the second post metal oxide anneal, and/or the plasma anneal which each anneal process may be done at various times within step 130. Interface 243 is a misaligned grain interface formed between the grain boundary of metal oxide host layer 232 and the grain boundary of crystalline metal oxide coupling layer 244. The misaligned grain interface facilitates oxygen vacancy between the crystalline metal-rich oxide host material of metal oxide host layer 232 and the crystalline metal-rich oxide coupling material of crystalline metal oxide coupling layer 244. Damage formed on the upper surface of metal oxide host layer 232 by the plasma exposure forms a portion of interface 243. The plasma may be formed from a gas containing argon, oxygen, ozone, an argon and oxygen mixture, or combinations thereof.

In one example, metal oxide host layer 232 containing a hafnium-rich oxide is deposited or otherwise formed on or over lower electrode 220 or silicon oxide layer 222. Metal oxide host layer 232 may have a thickness within a range from about 2 nm to about 3 nm. Thereafter, metal oxide host layer 232 is exposed to a first post metal oxide anneal at a temperature of about 750° C. for about 1 minute, then exposed to an argon plasma treatment for about 30 seconds. Crystalline metal oxide coupling layer 244 is deposited or otherwise formed on the treated metal oxide host layer 232. Crystalline metal oxide coupling layer 244 may have a thickness of about 1 nm. Thereafter, crystalline metal oxide coupling layer 244 is exposed to a second post metal oxide anneal at a temperature within a range from about 600° C. to about 750° C. for about 1 minute.

Memory device 200 containing metal oxide film stack 230, or a portion of metal oxide film stack 230, may optionally be exposed to a first annealing process, such as a post metal oxide anneal, during step 135 of process 100. In one embodiment, the post metal oxide anneal is subsequent to depositing or forming metal oxide host layer 232, but prior to forming amorphous metal oxide coupling layer 234 or crystalline metal oxide coupling layer 244. Alternatively, the post metal oxide anneal may be subsequent to forming amorphous metal oxide coupling layer 234 or crystalline metal oxide coupling layer 244. During the post metal oxide anneal, metal oxide film stack 230, metal oxide host layer 232, amorphous metal oxide coupling layer 234, and/or, crystalline metal oxide coupling layer 244 may be heated to an annealing temperature within a range from about 250° C. to about 800° C., such as from about 400° C. to about 700° C., or from about 500° C. to about 600° C., for example, about 550° C. Generally, memory device 200 containing any of the layers or films of metal oxide film stack 230 may be heated for a time period within a range from about 30 seconds to about 10 minutes, such as from about 1 minute to about 8 minutes, or from about 4 minutes to about 6 minutes during the post metal oxide anneal of step 135.

The post metal oxide anneal may be conducted within an annealing chamber, vacuum chamber, deposition chamber, or other processing chamber that provides heat to the layers contained within metal oxide film stack 230. In some examples, metal oxide film stack 230, metal oxide host layer 232, amorphous metal oxide coupling layer 234, and/or, crystalline metal oxide coupling layer 244 may be heated to an annealing temperature within a range from about 475° C. to about 625° C. for a time period within a range from about 3 minutes to about 7 minutes during the post metal oxide anneal at step 135. In one example, the annealing temperature of about 550° C. for about 5 minutes is used during the post metal oxide anneal.

FIG. 2A depicts memory device 200 containing metal oxide film stack 230 disposed between at least two electrodes, such as lower electrode 220 and upper electrode 250, and lower electrode 220 is disposed or otherwise supported on substrate 210. Substrate 210 supports lower electrode 220 while depositing and forming each of the layers within memory device 200—and for subsequent manufacturing processes. Substrate 210 may be wafer or other substrate and contain silicon, doped silicon, Group III-V materials (e.g., GaAs), or derivates thereof. In most examples described herein, substrate 210 is a crystalline silicon wafer that may be doped with a dopant element. Lower electrode 220 may contain a doped silicon material, for example p-type or n-type (N+) doped polysilicon. Lower electrode 220 may be deposited or otherwise formed on or over substrate 210 during step 110.

Lower electrode 220 and upper electrode 250 may independently contain or be formed of one material or multiple materials and generally contain or formed of different conductive materials relative to each other. Numerous exemplary electrode materials that may be useful for lower electrode 220 and upper electrode 250 are provided in the written description herein. These electrode materials are only exemplary and should not be limited in scope relative to the variety of materials that may be independently contained within lower electrode 220 and upper electrode 250. In some embodiments, lower electrode 220 and upper electrode 250 have work functions that differ by an energy level within a range from about 0.1 eV to about 1 eV, such as, from about 0.4 eV to about 0.6 eV. In some examples, lower electrode 220 may contain a n-type polysilicon material which has a work function within a range from about 4.1 eV to about 4.15 eV and upper electrode 250 may contain a titanium nitride material which has a work function within a range from about 4.5 eV to about 4.6 eV. Other exemplary electrode materials that may be contained within lower electrode 220 and/or upper electrode 250 include p-type polysilicon (about 4.9 eV to about 5.3 eV), transition metals, transition metal alloys, transition metal nitrides, transition metal carbides, tungsten (about 4.5 eV to about 4.6 eV), tantalum nitride (about 4.7 eV to about 4.8 eV), molybdenum oxide (about 5.1 eV), molybdenum nitride (about 4.0 eV to about 5.0 eV), iridium (about 4.6 eV to about 5.3 eV), iridium oxide (about 4.2 eV), ruthenium (about 4.7 eV), and ruthenium oxide (about 5.0 eV). Other exemplary electrode materials for lower electrode 220 and/or upper electrode 250 include a titanium/aluminum alloy (about 4.1 eV to about 4.3 eV), nickel (about 5.0 eV), tungsten nitride (about 4.3 eV to about 5.0 eV), tungsten oxide (about 5.5 eV to about 5.7 eV), aluminum (about 4.2 eV to about 4.3 eV), copper or silicon-doped aluminum (about 4.1 eV to about 4.4 eV), copper (about 4.5 eV), hafnium carbide (about 4.8 eV to about 4.9 eV), hafnium nitride (about 4.7 eV to about 4.8 eV), niobium nitride (about 4.95 eV), tantalum carbide (about 5.1 eV), tantalum silicon nitride (about 4.4 eV), titanium (about 4.1 eV to about 4.4 eV), vanadium carbide (about 5.15 eV), vanadium nitride (about 5.15 eV), and zirconium nitride (about 4.6 eV). For some embodiments described herein, the higher work function electrode receives a positive pulse (as measured compared to a common reference potential) during a reset operation, although other materials and configurations are possible.

In other embodiments, the higher work function electrode receives a negative pulse during a reset operation. In some examples, upper electrode 250 may contain metals, metal carbides, metal oxides, or metal nitrides, which include, for example, platinum, palladium, ruthenium, ruthenium oxide, iridium, iridium oxide, titanium, titanium nitride, tungsten, tungsten oxide, tungsten nitride, tungsten carbide, tantalum, tantalum oxide, tantalum nitride, tantalum silicon nitride, tantalum carbide, molybdenum, molybdenum oxide, molybdenum nitride, titanium aluminum alloys, nickel, aluminum, doped aluminum, aluminum oxide, copper, hafnium carbide, hafnium nitride, niobium nitride, vanadium carbide, vanadium nitride, zirconium nitride, derivatives thereof, or combinations thereof. In many examples, upper electrode 250 contains titanium, titanium nitride, alloys thereof, or combinations thereof.

Memory device 200 containing upper electrode 250 deposited, formed, or otherwise disposed on or over metal oxide film stack 230 may optionally be exposed to a second annealing process, such as a post electrode anneal, during step 145 of process 100. The post electrode anneal occurs subsequent to the formation of upper electrode 250. During the post electrode anneal, memory device 200, including upper electrode 250 and metal oxide film stack 230, may be heated to an annealing temperature within a range from about 400° C. to about 1,200° C., such as from about 500° C. to about 900° C., or from about 700° C. to about 800° C., for example, about 750° C. Generally, memory device 200 may be heated for a time period within a range from about 10 seconds to about 5 minutes, such as from about 20 seconds to about 4 minutes, or from about 40 seconds to about 2 minutes during the post upper electrode anneal of step 145. The post electrode anneal may be conducted within an annealing chamber, vacuum chamber, deposition chamber, or other processing chamber that provides heat to the layers contained within memory device 200, such as metal oxide film stack 230 and upper electrode 250.

In some examples, memory device 200 containing upper electrode 250 may be heated to an annealing temperature within a range from about 700° C. to about 800° C. for a time period within a range from about 40 seconds to about 2 minutes during the post upper electrode anneal at step 145. In one example, the annealing temperature of about 750° C. for about 1 minute is used during the annealing process.

Figure 3:
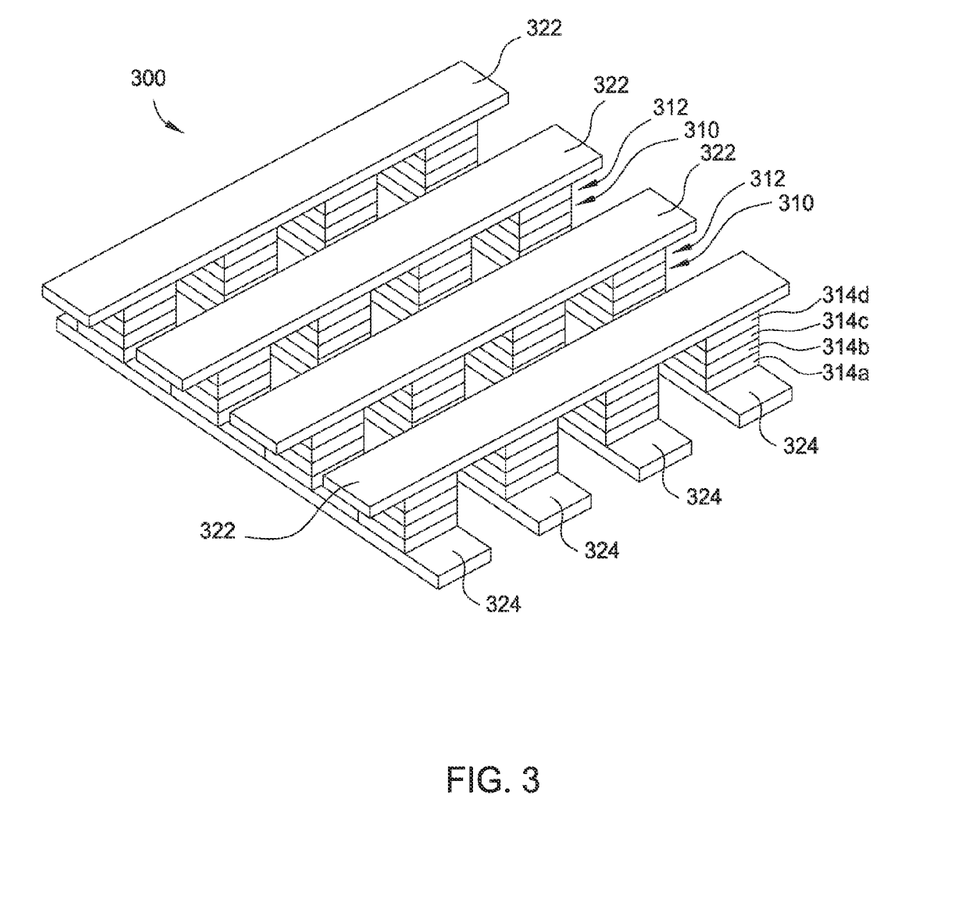
FIG. 3 depicts a memory array of resistive switching memory devices, as described by another embodiment herein.

FIG. 3 depicts a memory array 300 of resistive switching memory devices 310, as described by embodiments herein. Each memory device 310 contains at least one switching memory element 312, and may contain multiple switching memory elements 312. In some embodiments, memory devices 310 may be a plurality of memory devices 200, depicted in FIG. 2A. Each memory device 200 may independently contain any of the metal oxide film stacks 230 illustrated in FIGS. 2B-2C. Memory array 300 may be part of a larger memory device or other integrated circuit structure, such as a system on a chip type device. Read and write circuitry is connected to switching memory devices 310 using electrodes 322 and electrodes 324. Electrodes, such as upper electrodes 322 and lower electrodes 324, are sometimes referred to as word lines and bit lines, and are used to read and write data into the memory elements 312 in the switching memory devices 310. Individual switching memory devices 310 or groups of switching memory devices 310 can be addressed using appropriate sets of electrodes 322 and 324. The memory elements 312 in the switching memory devices 310 may be formed from a plurality of layers 314a, 314b, 314c, and 314d containing various materials, as indicated schematically in FIG. 3. In addition, memory arrays such as memory array 300 can be stacked in a vertical fashion to make multilayer memory array structures.

According to various embodiments, resistive-switching memory elements/devices are described herein. The memory elements/devices generally have a structure in which resistive-switching insulating layers are surrounded by two conductive electrodes. Some embodiments described herein are memory elements that include electrodes of different materials (e.g., one electrode is doped silicon and one is titanium nitride) surrounding a resistive-switching layer of a metal oxide (e.g., hafnium oxide), thickness (about 20 Å to about 100 Å) and a coupling layer that is substantially thinner than the resistive-switching layer (e.g., less than 25% the thickness of the resistive-switching layer). In some embodiments, the coupling layer may be a metallic material such as titanium. Memory elements including the coupling layer have exhibited improved switching characteristics (e.g., lower set, reset, and forming voltages, and better retention). In some embodiments, the resistive-switching layer includes a higher bandgap material (e.g., a material having a bandgap greater than 4 eV such as hafnium oxide, aluminum oxide, tantalum oxide, yttrium oxide, zirconium oxide, cerium oxide, alloys thereof, derivatives thereof, or combinations thereof), however other resistive-switching layers may include materials having a bandgap less than 4 eV (e.g., titanium oxide).

ALD Processes

The exemplary ALD processes for depositing or otherwise forming the metal oxide materials contained within metal oxide film stack 230 and other materials and/or layers contained within memory device 200 are typically conducted in a deposition chamber, such as an ALD chamber. The deposition chamber may maintain an internal pressure of less than 760 Torr, such as within the range from about 10 mTorr to about 10 Torr, such as from about 100 mTorr to about 1 Torr, for example, about 350 mTorr. The temperature of the memory device, the substrate, or the substrate carrier/pedestal is usually maintained within the range from about 50° C. to about 1,000° C., such as from about 100° C. to about 500° C., such as from about 200° C. to about 400° C., or such as from about 250° C. to about 300° C.

The metal source gas may be pulsed, introduced, or otherwise provided into the deposition chamber at a flow rate within the range from about 0.1 sccm to about 200 sccm, such as from about 0.5 sccm to about 50 sccm, from about 1 sccm to about 30 sccm, for example, about 10 sccm. The metal source gas may be provided along with a carrier gas, such as argon or nitrogen. The carrier gas may have a flow rate within the range from about 1 sccm to about 300 sccm, such as from about 2 sccm to about 80 sccm, from about 5 sccm to about 40 sccm, for example, about 20 sccm.

The metal source gas may be pulsed or otherwise provided into the deposition chamber at a rate within a range from about 0.01 seconds to about 10 seconds, depending on the particular process conditions, metal source gas or desired composition of the deposited metal oxide material. In one embodiment, such as for forming a metal-poor oxide material, the metal source gas may be pulsed, introduced, or otherwise provided into the deposition chamber at a rate within a range from about 1 second to about 10 seconds, such as from about 1 second to about 5 seconds, for example, about 3 seconds. In another embodiment, such as for forming a metal-rich oxide material, the metal source gas may be pulsed, introduced, or otherwise provided into the deposition chamber at a rate within a range from about 0.05 seconds to about 2 seconds, such as from about 0.1 seconds to about 1 second, for example, about 0.5 seconds. In many examples, the metal source gas is a hafnium precursor which is a tetrakis(dialkylamino)hafnium compound, such as tetrakis(dimethylamino) hafnium (($Me_2N)_4Hf$ or TDMAH), tetrakis(diethylamino) hafnium (($Et_2N)_4Hf$ or TDEAH), or tetrakis(ethylmethylamino) hafnium (($EtMeN)_4Hf$ or TEMAH).

The metal source gas is generally dispensed into a deposition chamber by introducing a carrier gas through an ampoule containing the metal source or precursor. An ampoule unit may include an ampoule, a bubbler, a canister, a cartridge, or other container used for storing, containing, or dispersing chemical precursors. In another example, the ampoule may contain a liquid precursor (e.g., TDMAH or TDEAH) and be part of a liquid delivery system containing injector valve system used to vaporize the liquid precursor with a heated carrier gas. Generally, the ampoule may be heated to a temperature of about 100° C. or less, such as within a range from about 30° C. to about 90° C., for example, about 50° C.

The oxidizing agent (e.g., $O_2$, $O_3$, $H_2O$) may be pulsed, introduced, or otherwise provided into the deposition chamber at a flow rate within a range from about 0.01 seconds to about 10 seconds, depending on the particular process conditions, oxygen source gas or oxidizing agent or desired composition of the deposited metal oxide material. In one embodiment, such as for forming a metal-poor oxide material, the oxidizing agent may be pulsed, introduced, or otherwise provided into the deposition chamber at a rate within a range from about 0.001 seconds to about 1 second, such as from about 0.001 seconds to about 0.1 seconds, for example, about 0.05 seconds. In another embodiment, such as for forming a metal-rich oxide material, the oxidizing agent may be pulsed, introduced, or otherwise provided into the deposition chamber at a rate within a range from about 0.5 second to about 10 seconds, such as from about 1 second to about 3 seconds, for example, about 2 seconds.

The oxidizing agent may contain or be formed of or generated from an oxygen source that includes oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), hydrogen peroxide ($H_2O_2$), derivatives thereof, plasmas thereof, or combinations thereof. Ozone may be formed inside or outside of the deposition chamber, such as the ALD chamber. In one example, the oxidizing agent contains ozone formed by an ozone generator positioned outside of the interior of the deposition chamber. Ozone is generated and then flowed or directed into the deposition chamber and exposed along with the metal source gas to the substrate surface. In another example, the oxidizing agent contains ozone formed by a plasma generated within the interior of the deposition chamber. Oxygen gas flowed or directed into the deposition chamber, then ignited or formed into ozone and/or atomic oxygen before being sequentially exposed along with the metal source gas to the substrate surface.

A carrier gas or a purge gas may be provided at the same time as the metal source gas and/or the oxygen source, but is also provided between the pulses of the metal source gas and/or the oxygen source. The carrier gas or purge gas may continuous flow during the ALD process or may be intermediately and/or sequentially pulsed, introduced, or otherwise provided during the ALD. The carrier gas or purge gas may be pulsed, introduced, or otherwise provided into the deposition chamber at a rate within a range from about 1 second to about 30 seconds, depending on the particular process conditions, source gases, or desired composition of the deposited metal oxide material. In one embodiment, the carrier gas or a purge gas may be pulsed, introduced, or otherwise provided into the deposition chamber at a rate within a range from about 1 second to about 30 seconds, such as from about 2 seconds to about 20 seconds, for example, about 10 seconds or about 15 seconds.

The carrier gas or purge gas may contain nitrogen, argon, helium, hydrogen, a forming gas, oxygen, mixtures thereof, or combinations thereof. The carrier gas or the purge gas may be sequentially pulsed, introduced, or otherwise provided after each pulse of the metal source gas and each pulse of the oxidizing agent during the ALD cycle. The pulses of purge gas or carrier gas are typically pulsed, introduced, or otherwise provided at a flow rate within a range from about 2 standard liters per minute (slm) to about 22 slm, such as about 10 slm. The specific purge gas flow rates and duration of process cycles are obtained through experimentation. In one example, a 300 mm diameter wafer requires about twice the flow rate for the same duration as a 200 mm diameter wafer in order to maintain similar throughput.

Many precursors are within the scope of embodiments of the invention for depositing the dielectric materials described herein. One important precursor property is to have a favorable vapor pressure. Precursors at ambient temperature and pressure may be gas, liquid, or solid. However, volatilized precursors are used within the ALD chamber. Organic-metallic compounds contain at least one metal atom and at least one organic-containing functional group, such as amides, alkyls, alkoxyls, alkylaminos, anilides, or derivatives thereof. Precursors may include organic-metallic, organometallic, inorganic, or halide compounds.

In one embodiment, the metal source gas is formed from or contains a tetrakis(dialkylamino) metal compound, such as a tetrakis(dialkylamino) hafnium compound, a tetrakis(dialkylamino) zirconium compound, or a tetrakis(dialkylamino) titanium compound. Tetrakis(dialkylamino) metal compounds are useful for depositing metal oxides contained within metal oxide film stack 230 and other materials and/or layers within memory device 200 during ALD processes.

In some examples, the metal source gas contains or is formed from exemplary hafnium precursors which include hafnium compounds containing ligands such as halides, alkylaminos, cyclopentadienyls, alkyls, alkoxides, derivatives thereof, or combinations thereof. Hafnium alkylamino compounds useful as hafnium precursors include tetrakis(dialkylamino) hafnium compounds, such as $(RR'N)_4Hf$, where R or R' are independently hydrogen, methyl, ethyl, propyl, or butyl. Hafnium halide compounds useful as hafnium precursors may include $HfCl_4$, $HfI_4$, and $HfBr_4$. Exemplary hafnium precursors useful for depositing hafnium oxides and other hafnium-containing materials contained within metal oxide film stack 230 and other materials and/or layers within memory device 200 during ALD processes include $(Et_2N)_4$Hf, $(Me_2N)_4$Hf, $(MeEtN)_4$Hf, $(^tBuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(^iPrC_5H_4)_2HfCl_2$, $(^iPrC_5H_4)HfCl_3$, $(^tBuC_5H_4)_2HfMe_2$, $(acac)_4$Hf, $(hfac)_4$Hf, $(tfac)_4$Hf, $(thd)_4$Hf, $(NO_3)_4$Hf, $(^tBuO)_4$Hf, $(^iPrO)_4$Hf, $(EtO)_4$Hf, $(MeO)_4$Hf, or derivatives thereof.

In other examples, the metal source gas contains or is formed from exemplary zirconium precursors which include zirconium compounds containing ligands such as halides, alkylaminos, cyclopentadienyls, alkyls, alkoxides, derivatives thereof, or combinations thereof. Zirconium alkylamino compounds useful as zirconium precursors include tetrakis (dialkylamino) zirconium compounds, such as $(RR'N)_4Zr$, where R or R' are independently hydrogen, methyl, ethyl, propyl, or butyl. Zirconium halide compounds useful as zirconium precursors may include $ZrCl_4$, $ZrI_4$, and $ZrBr_4$. Exemplary zirconium precursors useful for depositing zirconium oxides and other zirconium-containing materials contained within metal oxide film stack 230 and other materials and/or layers within memory device 200 during ALD processes include $(Et_2N)_4Zr$, $(Me_2N)_4Zr$, $(MeEtN)_4Zr$, $(^tBuC_5H_4)_2ZrCl_2$, $(C_5H_5)_2ZrCl_2$, $(EtC_5H_4)_2ZrCl_2$, $(Me_5C_5)_2ZrCl_2$, $(Me_5C_5)ZrCl_3$, $(^iPrC_5H_4)_2ZrCl_2$, $(^iPrC_5H_4)ZrCl_3$, $(^tBuC_5H_4)_2ZrMe_2$, $(acac)_4Zr$, $(hfac)_4Zr$, $(tfac)_4Zr$, $(thd)_4Zr$, $(NO_3)_4Zr$, $(^tBuO)_4Zr$, $(^iPrO)_4Zr$, $(EtO)_4Zr$, $(MeO)_4Zr$, or derivatives thereof.

In other examples, the metal source gas contains or is formed from exemplary titanium precursors which include titanium compounds containing ligands such as halides, alkylaminos, cyclopentadienyls, alkyls, alkoxides, derivatives thereof, or combinations thereof. Titanium alkylamino compounds useful as titanium precursors include tetrakis(dialkylamino) titanium compounds, such as $(RR'N)_4Ti$, where R or R' are independently hydrogen, methyl, ethyl, propyl, or butyl. Titanium halide compounds useful as titanium precursors may include $TiCl_4$, $TiI_4$, and $TiBr_4$. Exemplary titanium precursors useful for depositing titanium oxides and other titanium-containing materials contained within metal oxide film stack 230 and other materials and/or layers within memory device 200 during ALD processes include $(Et_2N)_4Ti$, $(Me_2N)_4Ti$, $(MeEtN)_4Ti$, $(^tBuC_5H_4)_2TiCl_2$, $(C_5H_5)_2TiCl_2$, $(EtC_5H_4)_2TiCl_2$, $(Me_5C_5)_2TiCl_2$, $(Me_5C_5)TiCl_3$, $(^iPrC_5H_4)_2TiCl_2$, $(^iPrC_5H_4)TiCl_3$, $(^tBuC_5H_4)_2TiMe_2$, $(acac)_4Ti$, $(hfac)_4Ti$, $(tfac)_4Ti$, $(thd)_4Ti$, $(NO_3)_4Ti$, $(^tBuO)_4Ti$, $(^iPrO)_4Ti$, $(EtO)_4Ti$, $(MeO)_4Ti$, or derivatives thereof.

In other examples, the metal source gas contains or is formed from exemplary aluminum precursors which include aluminum compounds containing ligands such as halides, alkyls, alkoxides, derivatives thereof, or combinations thereof. Alkyl aluminum compounds useful as aluminum precursors may have the generic chemical formula of $RR'R''Al$, where each R, R', and R" may independently be hydrogen, methyl, ethyl, propyl, or butyl. Aluminum alkoxide compounds useful as aluminum precursors may have the generic chemical formula of $(RO)(R'O)(R''O)Al$, where each R, R', and R" may independently be hydrogen, methyl, ethyl, propyl, or butyl. Aluminum halide compounds useful as aluminum precursors may include $AlCl_3$, or $AlF_3$. Exemplary aluminum precursors useful for depositing aluminum oxides and other aluminum-containing materials contained within metal oxide film stack 230, metal oxide coupling layer 234, and other materials and/or layers within memory device 200 during ALD processes include $Me_3Al$, $Me_2AlH$, $Et_3Al$, $Et_2AlH$, $Pr_3Al$, $Pr_2AlH$, $Bu_3Al$, $Bu_2AlH$, $(^tBuO)_3Al$, $(^iPrO)_3Al$, $(EtO)_3Al$, $(MeO)_3Al$, or derivatives thereof.

The ALD processes, as disclosed herein by the written description, are provided as exemplary ALD processes and should not be limited in scope relative to the variety of ALD processes that may be useful for depositing or otherwise forming the metal oxide materials contained within metal oxide film stack 230 and other materials and/or layers contained within memory device 200. Chemical precursors, carrier gases, pulse times, exposure times, flow rates, temperatures, pressures, sequence orders, and other variables may be adjusted accordingly in order to form the desired thickness and stoichiometry of the metal oxide materials contained within metal oxide film stack 230 and other materials and/or layers contained within memory device 200.

"ALD" as used herein refers to the sequential introduction of two or more reactive compounds to deposit a layer of material on a substrate surface. The two, three or more reactive compounds may alternatively be introduced into a reaction zone of a deposition chamber. Usually, each reactive compound is separated by a time delay to allow each compound to adhere and/or react on the substrate surface. In one aspect, a first precursor or compound A is pulsed into the reaction zone of a deposition chamber (e.g., ALD chamber) followed by a first time delay. Next, a second precursor or compound B is pulsed into the reaction zone followed by a second delay. During each time delay a purge gas, such as argon or nitrogen, may be pulsed or otherwise provided into the deposition chamber to purge the reaction zone or otherwise remove any residual reactive compound or by-products from the reaction zone or other surfaces. Alternatively, the purge gas may flow continuously throughout the deposition process so that only the purge gas flows during the time delay between pulses of reactive compounds. The reactive compounds are alternatively pulsed until a desired film or film thickness is formed on the substrate or deposition. In either scenario of a continuous or intermittent purge gas flow, the ALD process of pulsing compound A, purge gas, pulsing compound B, and purge gas is an ALD cycle. An ALD cycle can start with either compound A or compound B and continue the respective order of the ALD cycle until achieving a film with the desired thickness. In another aspect, a first precursor or compound A is pulsed into the reaction zone of a deposition chamber (e.g., ALD chamber) followed by a first time delay. Next, a second precursor or compound B is pulsed into the reaction zone followed by a second delay. Next, a third precursor or compound C is pulsed into the reaction zone followed by a third delay. During each time delay a purge gas, such as argon or nitrogen, may be pulsed or otherwise provided into the deposition chamber to purge the reaction zone or otherwise remove any residual reactive compound or by-products from the reaction zone or other surfaces. Alternatively, the purge gas may flow continuously throughout the deposition process so that only the purge gas flows during the time delay between pulses of reactive compounds. The reactive compounds are alternatively pulsed until a desired film or film thickness is formed on the substrate or deposition surface. In either scenario of a continuous or intermittent purge gas flow, the ALD process of pulsing compound A, purge gas, pulsing compound B, purge gas, pulsing compound C, and purge gas is an ALD cycle. Alternatively, the ALD process of pulsing compound A, purge gas, pulsing compound B, purge gas, pulsing compound C, purge gas, pulsing compound B, and purge gas is an ALD cycle. An ALD cycle can start with either compound A, compound B, or compound C and continue the respective order of the ALD cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the deposition chamber employed, the vacuum system coupled thereto, and the volatility/reactivity of the particular compound itself. A "half-reaction" as used herein is intended to refer to a pulse of precursor step followed by a purge step.

While the foregoing is directed to embodiments of the invention, other and further embodiments of the invention may be devised without departing from the basic scope thereof, and the scope thereof is determined by the claims that follow.

The invention claimed is:

1. A device comprising:
   a first electrode disposed on a substrate;
   a host layer disposed on the first electrode,
      the host layer comprising an exposed surface; and
   a coupling layer over the host layer,
      wherein the coupling layer and the host layer form a misaligned grain interface,
      the misaligned grain interface facilitating oxygen vacancy exchange between the coupling layer and the host layer.

2. The device of claim 1, wherein the host layer comprises a crystalline metal-rich oxide.

3. The device of claim 2, wherein the crystalline metal-rich oxide is represented by a generic chemical formula of $MO_x$, wherein M comprises one of hafnium, zirconium, or titanium, and wherein X is within a range from about 1.65 to about 1.95.

4. The device of claim 3, wherein X is within a range from about 1.70 to about 1.90.

5. The device of claim 1, wherein the coupling layer comprises an amorphous metal-rich oxide.

6. The device of claim 5, wherein the amorphous metal-rich oxide is represented by a generic chemical formula of $MM'_YO_Z$, wherein M comprises one of hafnium, zirconium, or titanium, M' comprises one of aluminum, yttrium, or lanthanum, wherein Y is within a range from about 0.05 to about 0.50, and wherein Z is within a range from about 1.50 to about 2.50.

7. The device of claim 6, wherein Y is within a range from about 0.05 to about 0.15, and wherein Z is within a range from about 1.50 to about 2.10.

8. The device of claim 6, wherein Y is within a range from about 0.40 to about 0.50, and wherein Z is within a range from about 2.10 to about 2.50.

9. The device of claim 1, wherein the host layer comprises a crystalline metal-rich oxide of a first metal, wherein the coupling layer comprises an amorphous metal-rich oxide of a second metal, and wherein the first metal and the second metal are same.

10. The device of claim 1, further comprising a silicon oxide layer between the first electrode and the host layer.

11. The device of claim 10, wherein the silicon oxide layer has a thickness of between about 2 Angstroms and 40 Angstroms.

12. The device of claim 1, wherein the host layer has a thickness of between about 5 Angstroms and 100 Angstroms.

13. The device of claim 1, wherein the coupling layer has a thickness of between about 3 Angstroms and 80 Angstroms.

14. The device of claim 1, wherein an average grain size of a material forming the host layer is greater than an average grain size of a material forming the coupling layer thereby causing the misaligned grain interface.

15. The device of claim 14, wherein a ratio of the average grain size of the material forming the host layer to the average grain size of the material forming the coupling layer is between about 1.05 and 2.0.

16. The device of claim 14, wherein a ratio of the average grain size of the material forming the host layer to the average grain size of the material forming the coupling layer is between about 1.10 and 1.50.

17. The device of claim 14, wherein the average grain size of the material forming the host layer is between about 30 nanometers and 40 nanometers.

18. The device of claim 1, wherein the host layer comprises hafnium oxide, and wherein the coupling layer comprises hafnium aluminate.

19. The device of claim 18, wherein a concentration of aluminum in the coupling layer is between about 20% atomic and 60% atomic relative to a concentration of hafnium.

20. The device of claim 18, wherein a concentration of aluminum in the coupling layer is between about 2% atomic and 20% atomic relative to a concentration of hafnium.

* * * * *